(12) United States Patent
Chen et al.

(10) Patent No.: US 10,472,228 B2
(45) Date of Patent: Nov. 12, 2019

(54) MEMS DEVICE PACKAGE AND METHOD FOR MANUFACTURING THE SAME

(71) Applicant: Advanced Semiconductor Engineering, Inc., Kaohsiung (TW)

(72) Inventors: Chien-Hua Chen, Kaohsiung (TW); Cheng-Yuan Kung, Kaohsiung (TW); Che-Hau Huang, Kaohsiung (TW); Chin-Cheng Kuo, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/680,056

(22) Filed: Aug. 17, 2017

(65) Prior Publication Data

US 2019/0055118 A1 Feb. 21, 2019

(51) Int. Cl.
*B81B 7/00* (2006.01)
*B81C 1/00* (2006.01)
*H03H 9/64* (2006.01)
*H03H 9/54* (2006.01)
*H03H 9/05* (2006.01)

(52) U.S. Cl.
CPC .......... *B81B 7/007* (2013.01); *B81C 1/00301* (2013.01); *B81B 2201/10* (2013.01); *B81B 2207/015* (2013.01); *B81B 2207/096* (2013.01); *B81B 2207/097* (2013.01); *B81C 2203/0778* (2013.01); *H03H 9/0547* (2013.01); *H03H 9/54* (2013.01); *H03H 9/6489* (2013.01)

(58) Field of Classification Search
CPC .............. B81B 7/007; B81B 2207/015; B81B 2207/097; B81B 2201/10; B81C 1/00301; B81C 2203/0778; H03H 9/54; H03H 9/6489

See application file for complete search history.

(56) References Cited

U.S. PATENT DOCUMENTS

| | | |
|---|---|---|
| 6,265,246 B1 | 7/2001 | Ruby et al. |
| 2006/0220173 A1* | 10/2006 | Gan .................... B81C 1/00269 257/528 |
| 2015/0014795 A1 | 1/2015 | Franosch et al. |

* cited by examiner

*Primary Examiner* — David Vu

(74) *Attorney, Agent, or Firm* — Foley & Lardner LLP; Cliff Z. Liu

(57) ABSTRACT

A Micro Electro-Mechanical System (MEMS) device package includes a first circuit layer, a partition wall, a MEMS component, a second circuit layer and a polymeric dielectric layer. The partition wall is disposed over the first circuit layer. The MEMS component is disposed over the partition wall and electrically connected to the first circuit layer. The first circuit layer, the partition wall and the MEMS component enclose a space. The second circuit layer is disposed over and electrically connected to the first circuit layer. The polymeric dielectric layer is disposed between the first circuit layer and the second circuit layer.

20 Claims, 20 Drawing Sheets

MEMS DEVICE PACKAGE AND METHOD FOR MANUFACTURING THE SAME

BACKGROUND

1. Technical Field

The present disclosure relates to a Micro Electro-Mechanical System (MEMS) device package and method for manufacturing the same, and more particularly to a MEMS device package having a space for a MEMS component to operate and method for manufacturing the same.

2. Description of the Related Art

A MEMS component such as surface acoustic wave (SAW) filter component specifies a sealed space to reduce interference of acoustic waves from the environment. The formation of the sealed spaced, however, is complicated and expensive.

SUMMARY

In some embodiments, a MEMS device package includes a first circuit layer, a partition wall, a MEMS component, a second circuit layer and a polymeric dielectric layer. The partition wall is disposed over the first circuit layer. The MEMS component is disposed over the partition wall and electrically connected to the first circuit layer. The first circuit layer, the partition wall and the MEMS component enclose a space. The second circuit layer is disposed over and electrically connected to the first circuit layer. The polymeric dielectric layer is disposed between the first circuit layer and the second circuit layer.

In some embodiments, a MEMS device package includes a first circuit layer, a MEMS component, a partition wall and a polymeric dielectric layer. The MEMS component is disposed over the first circuit layer. The first circuit layer and the MEMS component define a space in between. The partition wall is disposed over the first circuit layer and adjacent to the MEMS component. The polymeric dielectric layer is disposed over the first circuit layer, and separated from the space by the partition wall.

In some embodiments, a method for manufacturing a MEMS device package includes the following operations. A first circuit layer is formed over a carrier. A partition wall and a plurality of conductive pillars are formed over the first circuit layer. A MEMS component is disposed over the partition wall and the conductive pillars, wherein a periphery of the MEMS component is supported by the partition wall so as to define a space between the MEMS component and the first circuit layer. The MEMS component is electrically connected to the first circuit layer through the conductive pillars. A polymeric dielectric layer is formed over the first circuit layer, wherein the polymeric dielectric layer is restrained from entering the space by the partition wall. The carrier is released from the first circuit layer.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
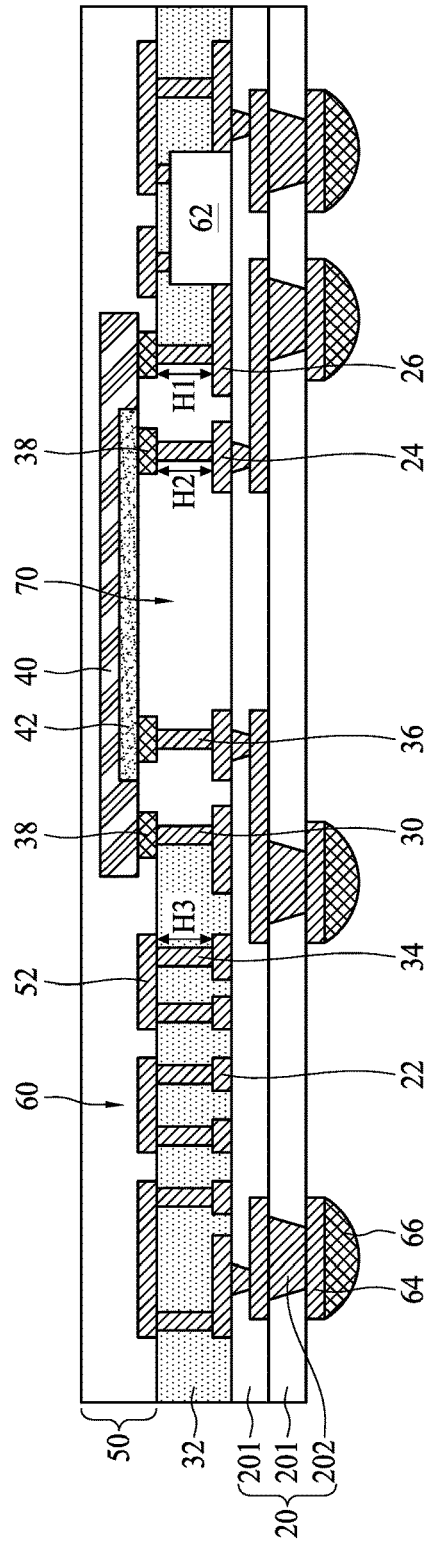
FIG. 1 illustrates a cross-sectional view of a MEMS device package in accordance with some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

At least some embodiments of the present disclosure are directed to a MEMS device package. In some embodiments, the MEMS device package defines a space formed between two circuit layers. The space may be defined and sealed by a partition wall. The partition wall may be formed integrally with fabrication of induction pillars or a circuit layer of the MEMS device package. Thus, the MEMS device package may omit an additional substrate. Accordingly, the thickness of the MEMS device package can be reduced, and the fabrication cost can be lowered.

FIG. 1 is a cross-sectional view of a MEMS device package 1 in accordance with some embodiments of the present disclosure. As shown in FIG. 1, the MEMS device package 1 includes a first circuit layer 20, a partition wall 30, a MEMS component 40, a second circuit layer 50 and a polymeric dielectric layer 32. In some embodiments, the first circuit layer 20 may include a redistribution layer (RDL) configured to redistribute circuit layout. By way of example, the first circuit layer 20 may include at least one insulative layer (or multiple insulative layers) 201 and at least one conductive layer (or multiple conductive layers) 202 stacked to one another. In some embodiments, the partition wall 30 is disposed over the first circuit layer 20. In some embodiments, the partition wall 30 may include, but is not limited to, a conductive partition wall formed of conductive material (such as a metal or an alloy or other combination of two or more metals).

In some embodiments, the MEMS component 40 is disposed over the partition wall 30 and electrically connected to the first circuit layer 20. The second circuit layer 50 is disposed over and electrically connected to the first circuit layer 20. In some embodiments, the second circuit layer 50 may include another RDL configured to redistribute circuit layout. The polymeric dielectric layer 32 is disposed between the first circuit layer 20 and the second circuit layer 50. In some embodiments, the polymeric dielectric layer 32 may include a molding compound layer. By way of example, the material of the polymeric dielectric layer 32 may include, but is not limited to, polyimide (PI), polybenzoxazole (PBO) or other suitable materials. In some embodiments, the MEMS component 40 is disposed over and exposed from the polymeric dielectric layer 32.

The MEMS device package 1 defines a space 70 enclosed by the first circuit layer 20, the partition wall 30 and the MEMS component 40. In some embodiments, the partition wall 30 laterally surrounds the space 70, the first circuit layer 20 is at the bottom of the space 70, and the MEMS component 40 covers the top of the space 70. In some embodiments, the space 70 is sealed by the first circuit layer 20, the partition wall 30 and the MEMS component 40; and the polymeric dielectric layer 32 is separated from the space 70 by the partition wall 30. In some embodiments, the partition wall 30 is disposed substantially along a periphery of the space 70 and surrounds the space 70.

In some embodiments, the MEMS component 40 may further include an active structure 42 electrically connected to the first circuit layer 20. The active structure 42 is exposed to the space 70, which allows operation of the active structure 42 of the MEMS component 40. In some embodiments, the MEMS component 40 may include, but is not limited to, an acoustic component such as a surface wave acoustic (SAW) filter component or a bulk acoustic wave (BAW) filter component; and the active structure 42 may include an acoustic wave structure. In some embodiments, the space 70 is a sealed space for reducing acoustic wave interference from the environment outside of the MEMS component 40.

In some embodiments, the MEMS device package 1 may further include conductive pillars 36 disposed in the space 70. The conductive pillars 36 may be surrounded by the partition wall 30. In some embodiments, both the partition wall 30 and the conductive pillars 36 support the MEMS component 40. In some embodiments, the partition wall 30 and the conductive pillars 36 may be electrically disconnected from each other. In some embodiments, the active structure 42 of the MEMS component 40 may be electrically connected to the first circuit layer 20 through the conductive pillars 36. In some embodiments, the MEMS component 40 may be bonded to the partition wall 30 and the conductive pillars 36 through conductive structures 38 (such as conductive bumps, conductive pastes, or the like).

In some embodiments, the MEMS device package 1 may further include connecting pads 24 and a landing pad 26. The connecting pads 24 are disposed over the first circuit layer 20 and electrically connected to the first conductive pillars 36, respectively. The landing pad 26 is disposed over the first circuit layer 20 and connected to the partition wall 30. In some embodiments, the landing pad 26 is disposed substantially along a periphery of the space 70 and surrounds the connecting pads 24.

In some embodiments, the MEMS device package 1 may further include an electronic component 60 (e.g., including induction pillars 34) disposed between the first circuit layer 20 and the second circuit layer 50, and electrically connected to the MEMS component 40 through the first circuit layer 20 and/or the second circuit layer 50. In some embodiments, the MEMS device package 1 may further include first conductive pieces 22 and second conductive pieces 52. In some embodiments, the first conductive pieces 22 are disposed between the first circuit layer 20 and the polymeric dielectric layer 32, and the second conductive pieces 52 are disposed in the second circuit layer 50. In some embodiments, the electronic component 60 includes induction pillars 34 through the polymeric dielectric layer 32 and electrically connected to the first conductive pieces 22 and the second conductive pieces 52. In some embodiments, each of the induction pillars 34 penetrates through the polymeric dielectric layer 32, and is interconnected between a respective one of the first conductive pieces 22 and a respective one of the second conductive pieces 52, thereby forming an inductor electrically connected to the first circuit layer 20 and the second circuit layer 50. In some embodiments, the partition wall 30, the conductive pillars 36 and the induction pillars 34 may be simultaneously formed from the same conductive material, and a height H1 of the partition wall 30, a height H2 of the conductive pillar 36 and a height H3 of the induction pillar 34 may be substantially the same. In some embodiments, the first conductive pieces 22, the connecting pads 24 and the landing pad 26 may be simultaneously formed from the same conductive material.

In some embodiments, the MEMS device package 1 may further include a second electronic component 62 disposed between the first circuit layer 20 and the second circuit layer 50, and electrically connected to the MEMS component 40 through the first circuit layer 20 and/or the second circuit layer 50. In some embodiments, the second electronic component 62 may include one or more semiconductor dies in the form of one or more integrated circuits (ICs) (such as packaged semiconductor dies). In some embodiments, the second electronic component 62 may include, but is not limited to, at least one active component such as a processor component, a switch component, an application specific IC (ASIC) or another active component. In some embodiments, the second electronic component 62 may include, but is not limited to, at least one passive component such as a capacitor, a resistor, or the like.

In some embodiments, the MEMS device package 1 may further include bonding pads 64 disposed over and electrically connected to the first circuit layer 20. In some embodiments, the MEMS device package 1 may further include conductive bumps 66 mounted over and electrically connected to the bonding pads 64, respectively. The conductive bumps 66 may be coupled to an external electronic component such as a printed circuit board (PCB) or the like.

Figure 2A:
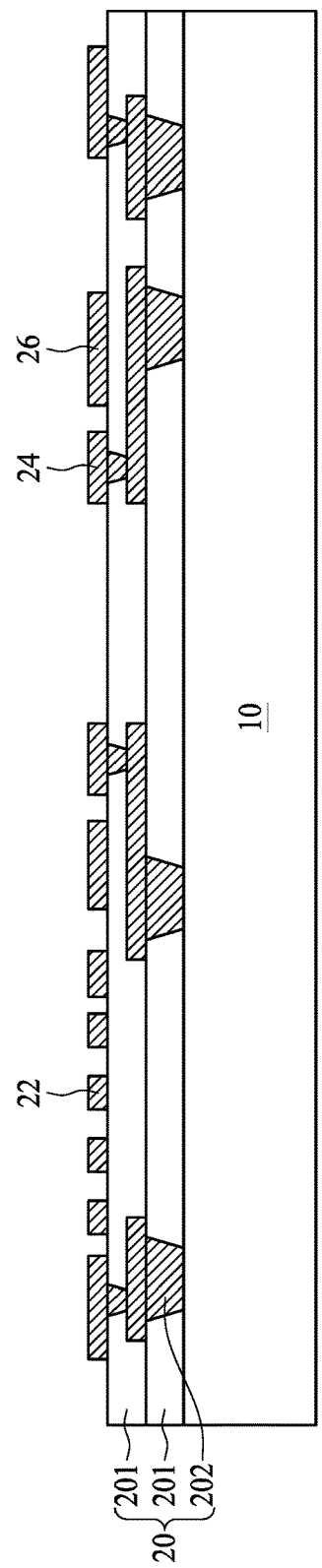
FIG. 2A illustrates one or more stages of an example of a manufacturing method of a MEMS device package in accordance with some embodiments of the present disclosure.

FIG. 2A, FIG. 2B, FIG. 2C and FIG. 2D illustrate various stages of an example of a manufacturing method of the MEMS device package 1 in accordance with some embodiments of the present disclosure. As depicted in FIG. 2A, a first circuit layer 20 is formed over a carrier 10. The carrier 10 is configured as a temporary substrate for supporting the first circuit layer 20, and may be released from the first circuit layer 20 subsequently. In some embodiments, the carrier 10 may include, but is not limited to, a glass substrate. In some embodiments, first conductive pieces 22, connecting pads 24 and a landing pad 26 may be formed over the first circuit layer 20. In some embodiments, the first conductive pieces 22, the connecting pads 24 and the landing pad 26 may be simultaneously formed from the same conductive material.

Figure 2B:
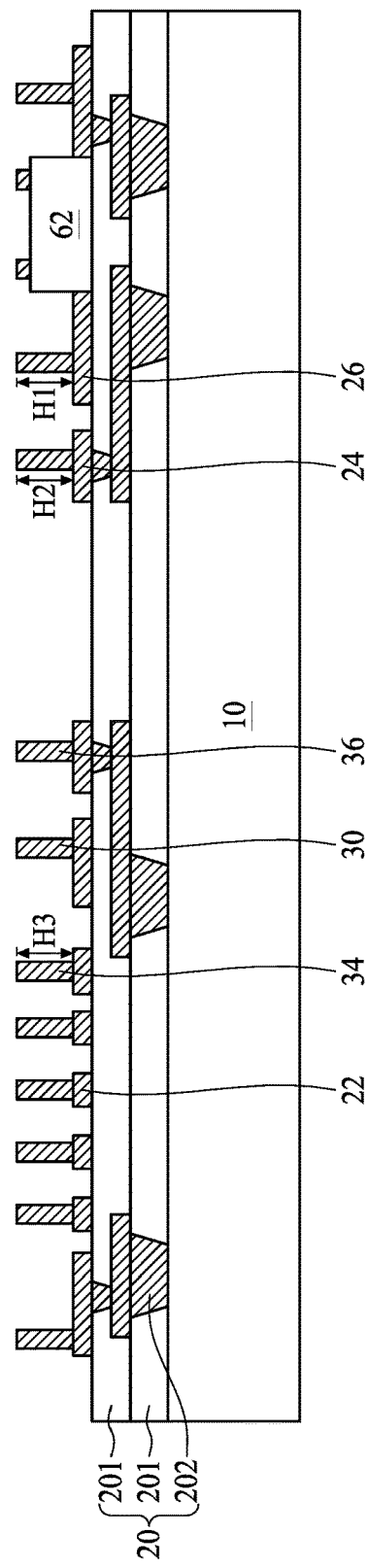
FIG. 2B illustrates one or more stages of an example of a manufacturing method of a MEMS device package in accordance with some embodiments of the present disclosure.

As depicted in FIG. 2B, induction pillars 34 may be formed over the first circuit layer 20, and electrically connected to the first conductive pieces 22. In some embodiments, a partition wall 30 and conductive pillars 36 may be formed over the first circuit layer 20. In some embodiments, the induction pillars 34, the partition wall 30 and the conductive pillars 36 are formed simultaneously from the same material. A height H1 of the partition wall 30, a height H2 of the conductive pillar 36 and a height H3 of the induction pillar 34 may be substantially the same. In some embodiments, a second electronic component 62 may be further disposed over the first circuit layer 20.

Figure 2C:
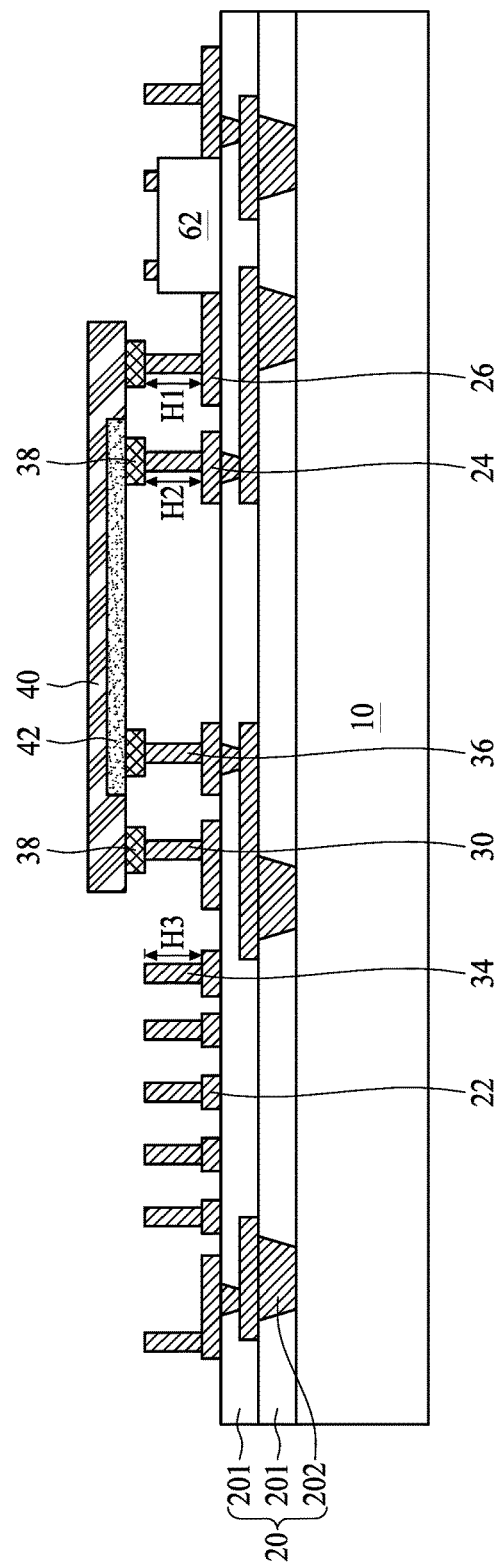
FIG. 2C illustrates one or more stages of an example of a manufacturing method of a MEMS device package in accordance with some embodiments of the present disclosure.

As depicted in FIG. 2C, a MEMS component 40 is disposed over the partition wall 30 and the conductive pillars 36. In some embodiments, the MEMS component 40 may be bonded to the partition wall 30 and the conductive pillars 36 through conductive structures 38 (such as conductive bumps, conductive pastes, or the like). The periphery of the MEMS component 40 is supported by the partition wall 30 so as to enclose a space 70 between the MEMS component 40 and the first circuit layer 20. The active structure 42 of the MEMS component 40 is electrically connected to the first circuit layer 20 through the conductive pillars 36.

Figure 2D:
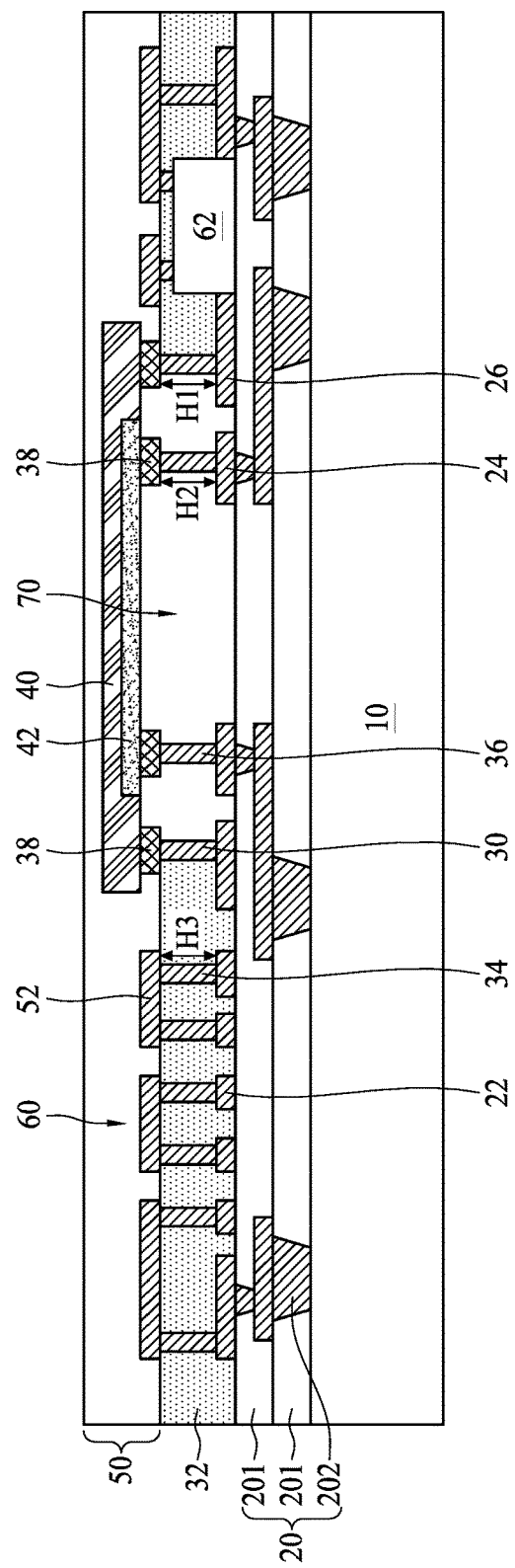
FIG. 2D illustrates one or more stages of an example of a manufacturing method of a MEMS device package in accordance with some embodiments of the present disclosure.

As depicted in FIG. 2D, a polymeric dielectric layer 32 is formed over the first circuit layer 20. In some embodiments, the polymeric dielectric layer 32 may be formed by, for example, dispensing a fluidic molding compound over the first circuit layer 20, and curing the fluidic molding compound. The polymeric dielectric layer 32 may pass through gaps between the induction pillars 34, but the polymeric dielectric layer 32 is restrained from entering the space 70 by the partition wall 30.

In some embodiments, a second circuit layer 50 is further formed over the polymeric dielectric layer 32. In some embodiments, the second conductive pieces 52 may be a portion of the second circuit layer 50. The induction pillars 34 are interconnected between the first conductive pieces 22 and the second conductive pieces 52, and form the electronic component 60. In some embodiments, the second circuit layer 50 further covers the MEMS component 40. The carrier 10 is released from the first circuit layer 20. In some embodiments, bonding pads 64 are formed over and electrically connected to the first circuit layer 20, and conductive bumps 66 are mounted over and electrically connected to the bonding pads 64, respectively. Accordingly, the MEMS device package 1 as shown in FIG. 1 is formed.

In some embodiments of the present disclosure, the space 70 of the MEMS device package 1 is formed between the first circuit layer 20 and the MEMS component 40, and is sealed by the partition wall 30 without an extra substrate. Accordingly, the thickness of the MEMS device package 1 can be reduced. The partition wall 30 may be integrated with fabrication of the electronic component 60, and thus, fabrication operations and costs can be reduced.

The MEMS device package and manufacturing method of the present disclosure are not limited to the above-mentioned embodiments, and may include other different embodiments. To simplify the description and for the convenience of comparison between each of the embodiments of the present disclosure, the same or similar components in each of the following embodiments are marked with the same numerals and are not redundantly described.

Figure 3:
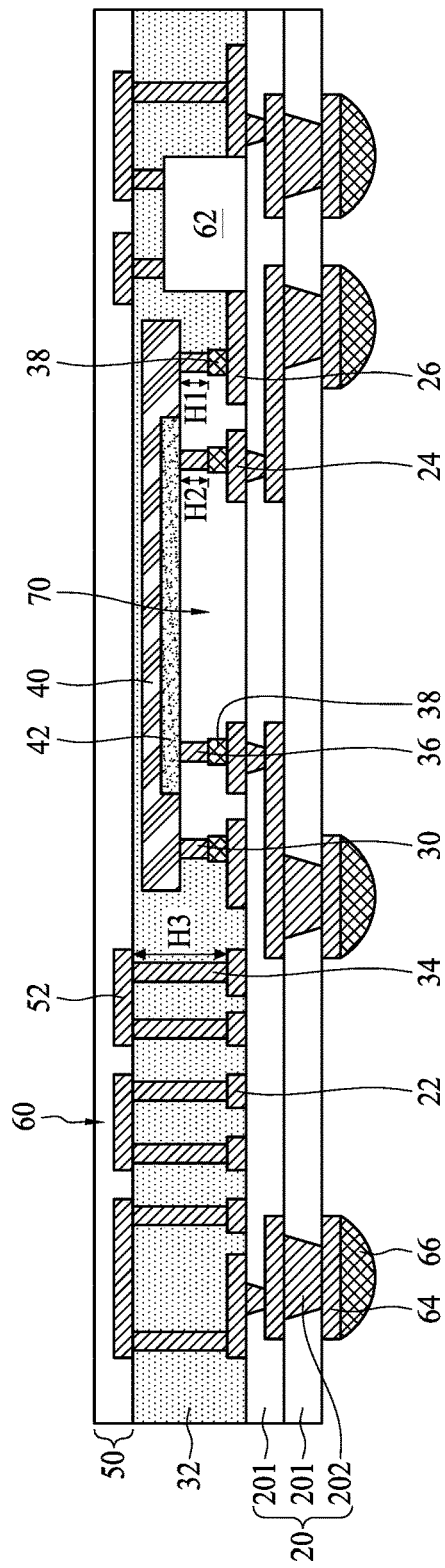
FIG. 3 illustrates a cross-sectional view of a MEMS device package in accordance with some embodiments of the present disclosure.

FIG. 3 is a cross-sectional view of a MEMS device package 2 in accordance with some embodiments of the present disclosure. In contrast to the MEMS device package 1 as shown in FIG. 1, the height H1 of the partition wall 30 and the height H2 of the conductive pillar 36 are substantially the same, but the height H1 of the partition wall 30 and the height H2 of the conductive pillar 36 are lower than the height H3 of the induction pillar 34. In some embodiments, the partition wall 30 and the conductive pillar 36 are formed over the MEMS component 40, and bonded to the landing pad 26 and the connecting pads 24 respectively through the conductive structures 38. As depicted in FIG. 3, with shorter partition wall 30 and conductive pillar 36, the height of the space 70 can be reduced, and thus the thickness of the MEMS device package 1 can be further reduced. In some embodiments, at least a portion of the MEMS component 40 is enclosed by the polymeric dielectric layer 32. For example, edges and an upper surface of the MEMS component 40 are enclosed by the polymeric dielectric layer 32. Accordingly, the MEMS component 40 can be protected by the polymeric dielectric layer 32.

Figure 4A:
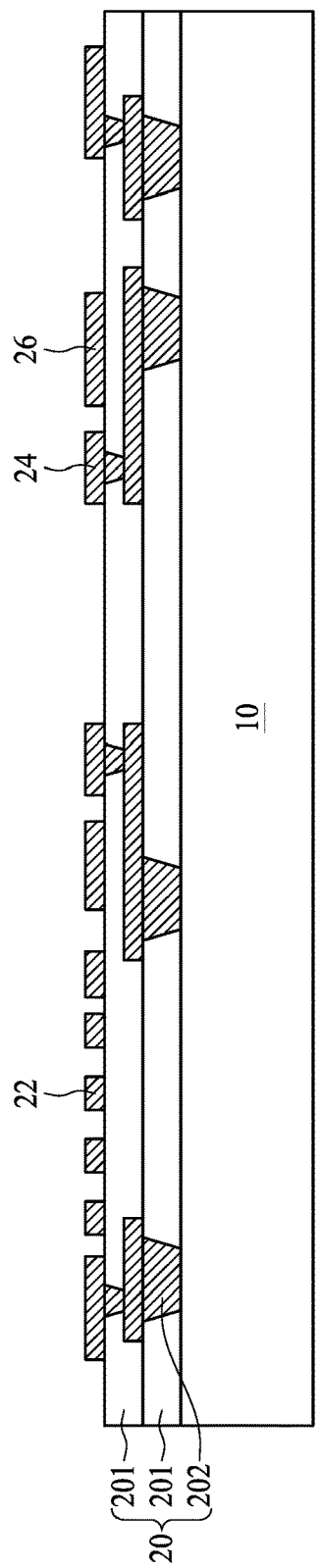
FIG. 4A illustrates one or more stages of an example of a manufacturing method of a MEMS device package in accordance with some embodiments of the present disclosure.

FIG. 4A, FIG. 4B, FIG. 4C and FIG. 4D illustrate various stages of an example of a manufacturing method of the MEMS device package 2 in accordance with some embodiments of the present disclosure. As depicted in FIG. 4A, a first circuit layer 20 is formed over a carrier 10. In some embodiments, first conductive pieces 22, connecting pads 24 and a landing pad 26 may be formed over the first circuit layer 20. In some embodiments, the first conductive pieces 22, the connecting pads 24 and the landing pad 26 may be simultaneously formed from the same conductive material.

Figure 4B:
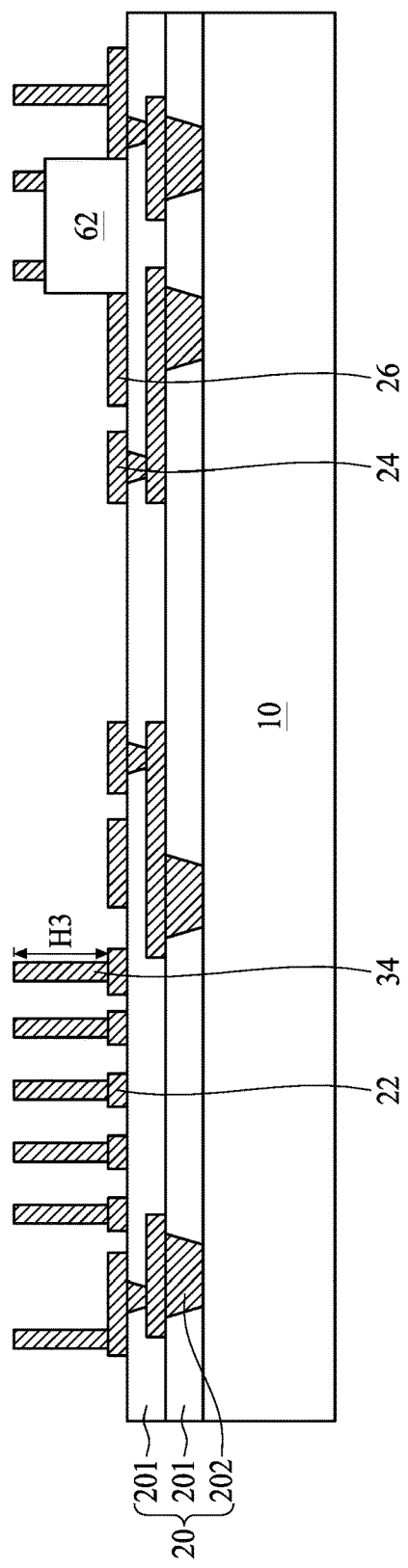
FIG. 4B illustrates one or more stages of an example of a manufacturing method of a MEMS device package in accordance with some embodiments of the present disclosure.

As depicted in FIG. 4B, induction pillars 34 are formed over the first circuit layer 20, and electrically connected to the first conductive pieces 22. In some embodiments, a second electronic component 62 may be disposed over the first circuit layer 20.

Figure 4C:
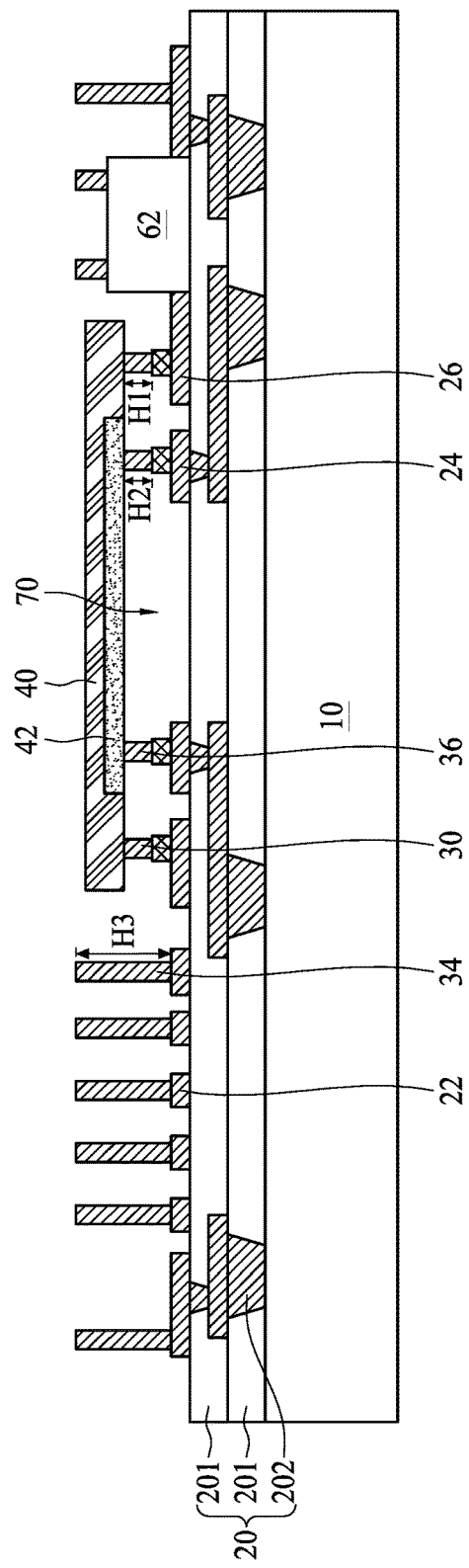
FIG. 4C illustrates one or more stages of an example of a manufacturing method of a MEMS device package in accordance with some embodiments of the present disclosure.

As depicted in FIG. 4C, a MEMS component 40 is disposed over the first circuit layer 20. In some embodiments, the partition wall 30 and the conductive pillar 36 are formed over the MEMS component 40, and bonded to the landing pad 26 and the connecting pads 24 respectively through the conductive structures 38. The periphery of the MEMS component 40 is supported by the partition wall 30 so as to enclose a space 70 between the MEMS component 40 and the first circuit layer 20. The active structure 42 of the MEMS component 40 is electrically connected to the first circuit layer 20 through the conductive pillars 36. The height H1 of the partition wall 30 and the height H2 of the conductive pillar 36 are substantially the same. The height H1 of the partition wall 30 and the height H2 of the conductive pillar 36 are lower than the height H3 of the induction pillar 34.

Figure 4D:
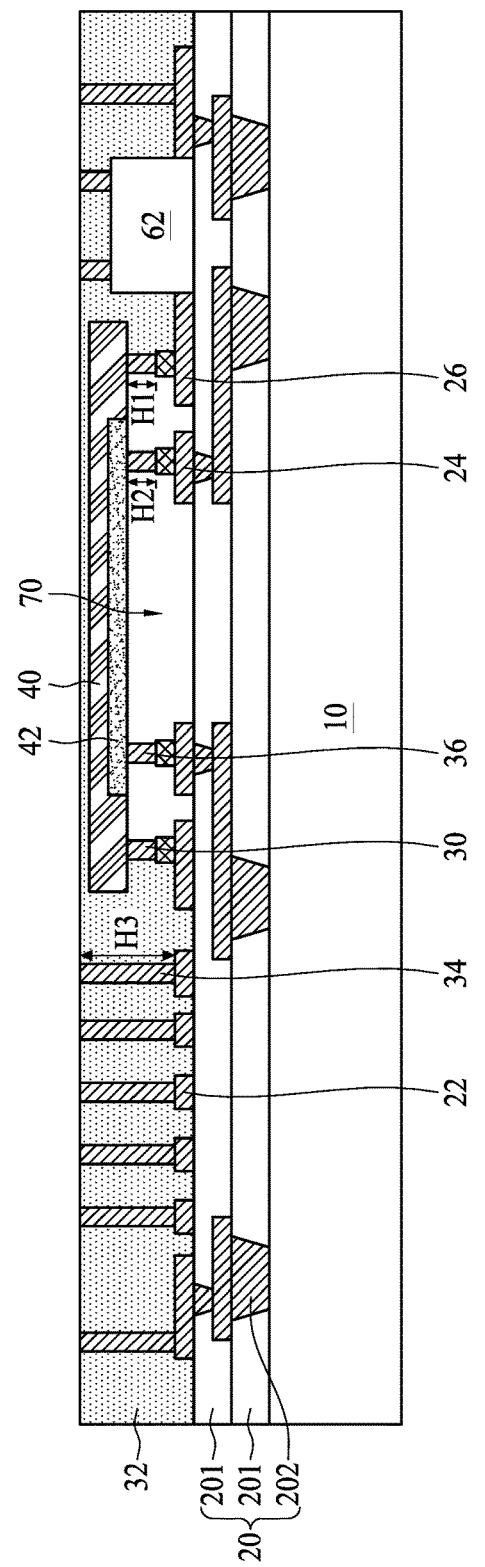
FIG. 4D illustrates one or more stages of an example of a manufacturing method of a MEMS device package in accordance with some embodiments of the present disclosure.

As depicted in FIG. 4D, a polymeric dielectric layer 32 is formed over the first circuit layer 20. In some embodiments, the polymeric dielectric layer 32 may be formed by, for example, dispensing a fluidic molding compound over the first circuit layer 20 and the MEMS component 40, and curing the fluidic molding compound. The polymeric dielectric layer 32 may pass through gaps between the induction pillars 34, but the polymeric dielectric layer 32 is restrained from entering the space 70 by the partition wall 30. In some embodiments, at least a portion of the MEMS component 40 is enclosed by the polymeric dielectric layer 32. For example, edges and an upper surface of the MEMS component 40 are enclosed by the polymeric dielectric layer 32.

In some embodiments, a second circuit layer 50 including the second conductive pieces 52 is further formed over the polymeric dielectric layer 32. The induction pillars 34 are interconnected between the first conductive pieces 22 and the second conductive pieces 52, and form the electronic component 60. The carrier 10 is released from the first circuit layer 20. In some embodiments, bonding pads 64 are formed over and electrically connected to the first circuit layer 20, and conductive bumps 66 are mounted over and electrically connected to the bonding pads 64, respectively. Accordingly, the MEMS device package 2 as shown in FIG. 3 is formed.

Figure 5:
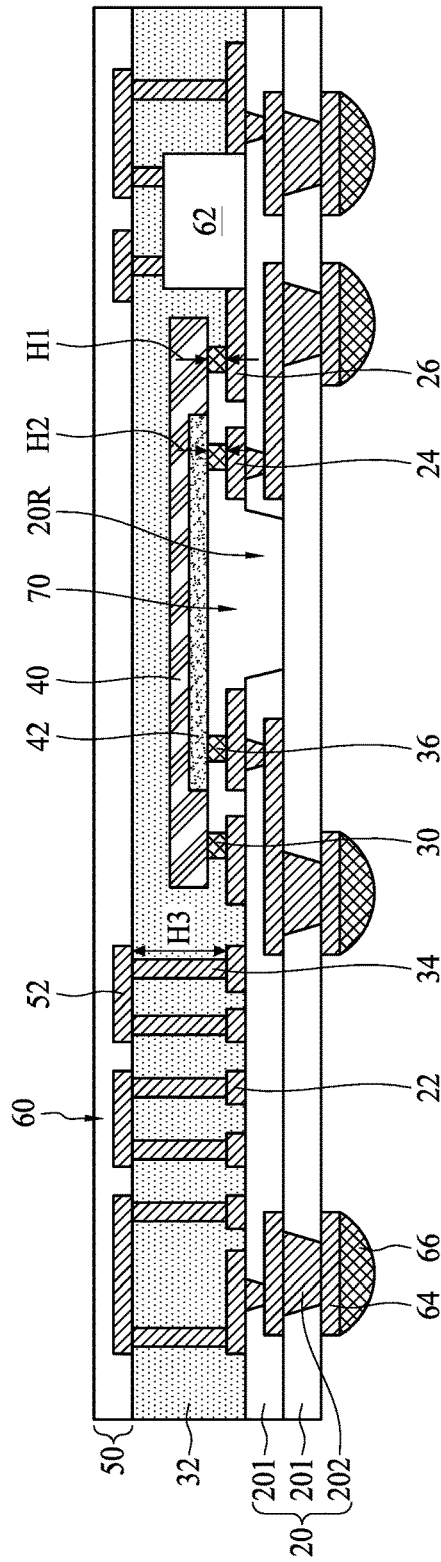
FIG. 5 illustrates a cross-sectional view of a MEMS device package in accordance with some embodiments of the present disclosure.

FIG. 5 is a cross-sectional view of a MEMS device package 3 in accordance with some embodiments of the present disclosure. As shown in FIG. 5, the height H1 of the partition wall 30 and the height H2 of the conductive pillar 36 are substantially the same, but the height H1 of the partition wall 30 and the height H2 of the conductive pillar 36 are lower than the height H3 of the induction pillar 34. In contrast to the MEMS device package 2 as shown in FIG. 3, the partition wall 30 and the conductive pillar 36 are shorter, and may be configured to bond the MEMS component 40 to the first circuit layer 20. In some embodiments, the partition wall 30 and the conductive pillars 36 may include conductive structures such as conductive bumps, conductive pastes or the like, and thus additional conductive structures may be omitted. In some embodiments, the first circuit layer 20 may further define a recess 20R configured as a portion of the space 70.

Figure 6A:
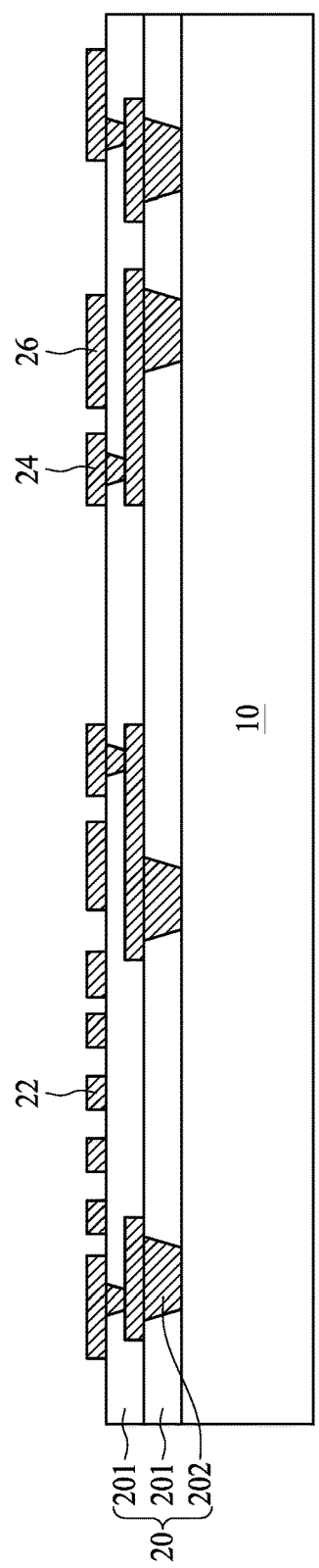
FIG. 6A illustrates one or more stages of an example of a manufacturing method of a MEMS device package in accordance with some embodiments of the present disclosure.

FIG. 6A, FIG. 6B, FIG. 6C and FIG. 6D illustrate various stages of an example of a manufacturing method of the MEMS device package 3 in accordance with some embodiments of the present disclosure. As depicted in FIG. 6A, a first circuit layer 20 is formed over a carrier 10. In some embodiments, first conductive pieces 22, connecting pads 24 and a landing pad 26 may be formed over the first circuit layer 20. In some embodiments, the first conductive pieces 22, the connecting pads 24 and the landing pad 26 may be simultaneously formed from the same conductive material.

Figure 6B:
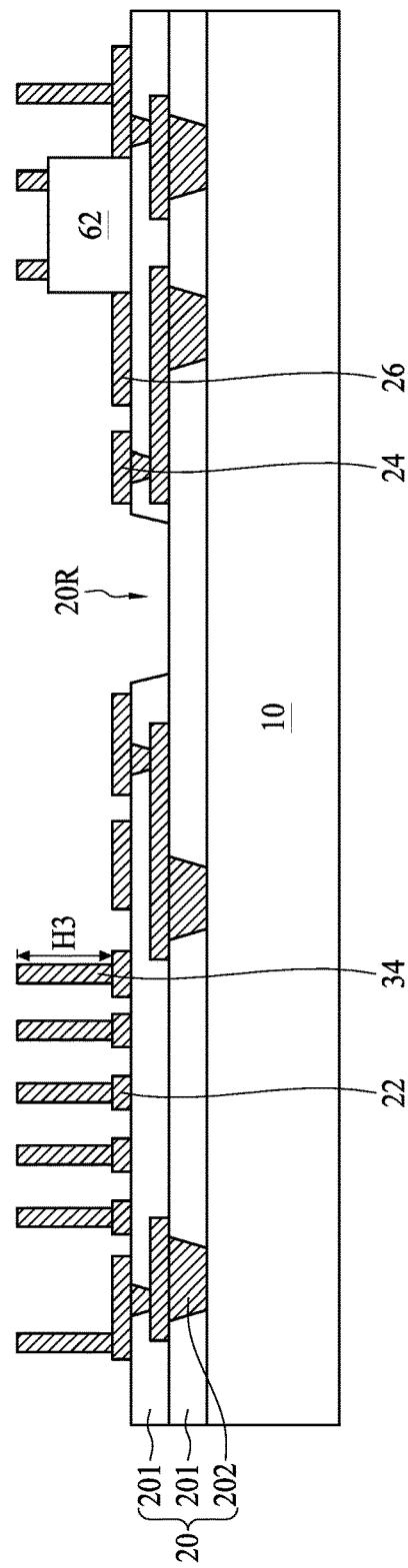
FIG. 6B illustrates one or more stages of an example of a manufacturing method of a MEMS device package in accordance with some embodiments of the present disclosure.

As depicted in FIG. 6B, a recess 20R is formed in the first circuit layer 20. In some embodiments, a portion of the first circuit layer 20 such as a portion of the insulative layer 201 is removed to define the recess 20R. In some embodiments, induction pillars 34 are formed over the first circuit layer 20, and electrically connected to the first conductive pieces 22. In some embodiments, a second electronic component 62 may be disposed over the first circuit layer 20.

Figure 6C:
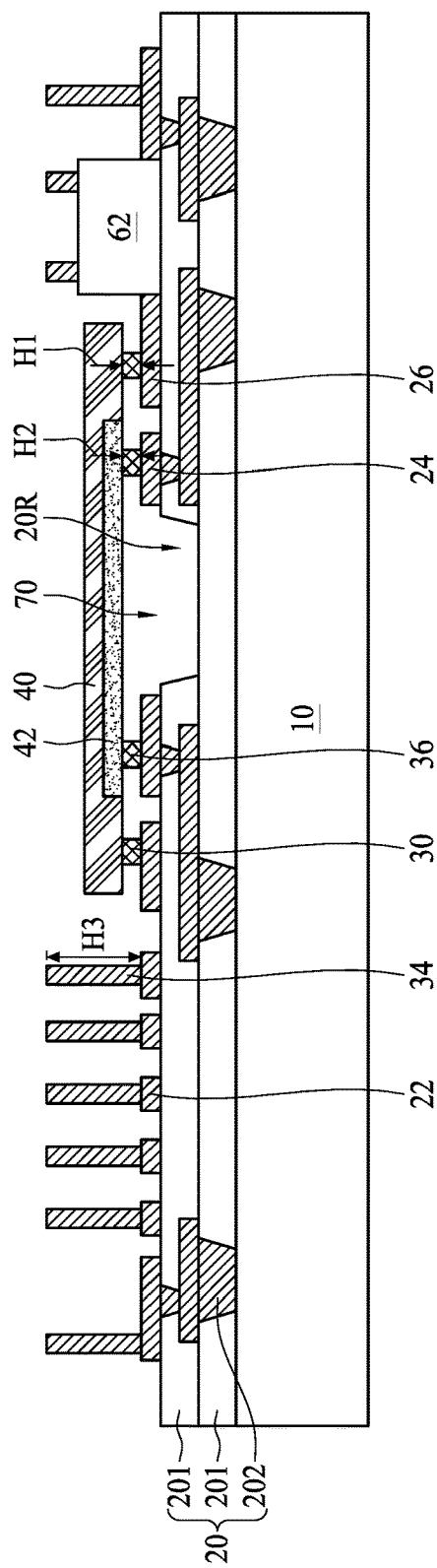
FIG. 6C illustrates one or more stages of an example of a manufacturing method of a MEMS device package in accordance with some embodiments of the present disclosure.

As depicted in FIG. 6C, a MEMS component 40 is disposed over the first circuit layer 20. In some embodiments, the partition wall 30 and the conductive pillars 36 may include conductive structures such as conductive bumps, conductive pastes or the like, which may also be configured as conductive adhesives to bond the MEMS component 40 and the first circuit layer 20, and thus additional conductive structures may be omitted. The periphery of the MEMS component 40 is supported by the partition wall 30 so as to enclose the space 70, which includes the recess 20R. The active structure 42 of the MEMS component 40 is electrically connected to the first circuit layer 20 through the conductive pillars 36.

Figure 6D:
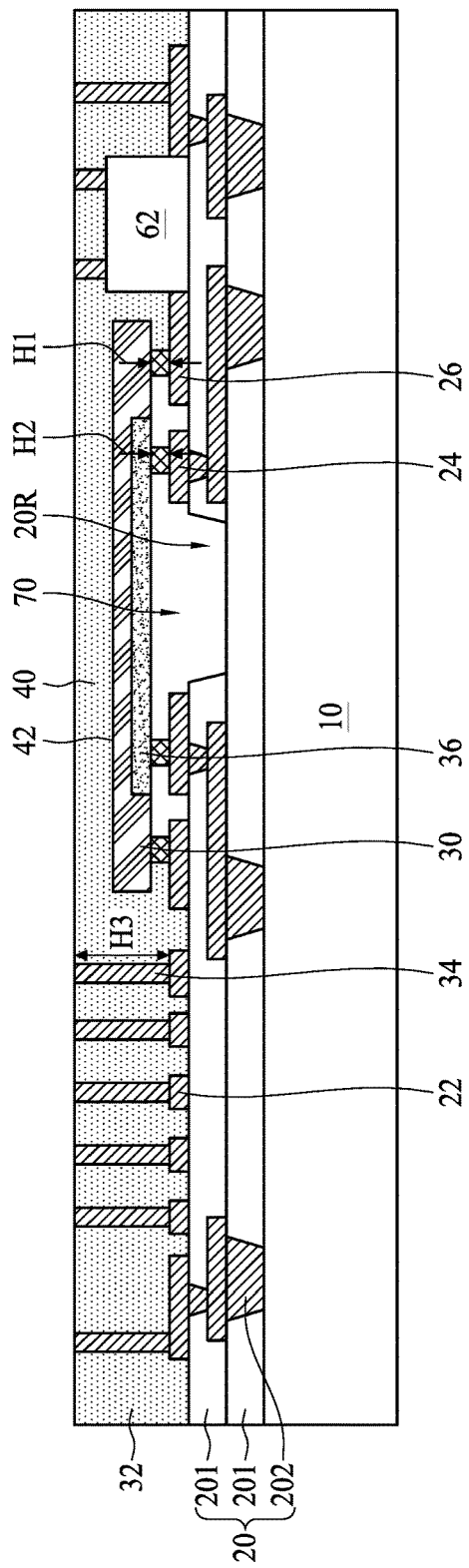
FIG. 6D illustrates one or more stages of an example of a manufacturing method of a MEMS device package in accordance with some embodiments of the present disclosure.

As depicted in FIG. 6D, a polymeric dielectric layer 32 is formed over the first circuit layer 20. In some embodiments, the polymeric dielectric layer 32 may be formed by, for example, dispensing a fluidic molding compound over the first circuit layer 20 and the MEMS component 40, and curing the fluidic molding compound. The polymeric dielectric layer 32 may pass through gaps between the induction pillars 34, but the polymeric dielectric layer 32 is restrained from entering the space 70 by the partition wall 30. In some embodiments, edges and an upper surface of the MEMS component 40 are enclosed by the polymeric dielectric layer 32.

In some embodiments, a second circuit layer 50 including the second conductive pieces 52 is further formed over the polymeric dielectric layer 32. The induction pillars 34 are interconnected between the first conductive pieces 22 and the second conductive pieces 52, and form the electronic component 60. The carrier 10 is released from the first circuit layer 20. In some embodiments, bonding pads 64 are formed over and electrically connected to the first circuit layer 20, and conductive bumps 66 are mounted over and electrically connected to the bonding pads 64, respectively. Accordingly, the MEMS device package 3 as shown in FIG. 5 is formed.

In some embodiments of the present disclosure, a portion of the space 70 of the MEMS device package 3 is formed by creating a recess in the first circuit layer 20, and thus the thickness of the MEMS device package 3 can be further reduced.

Figure 7:
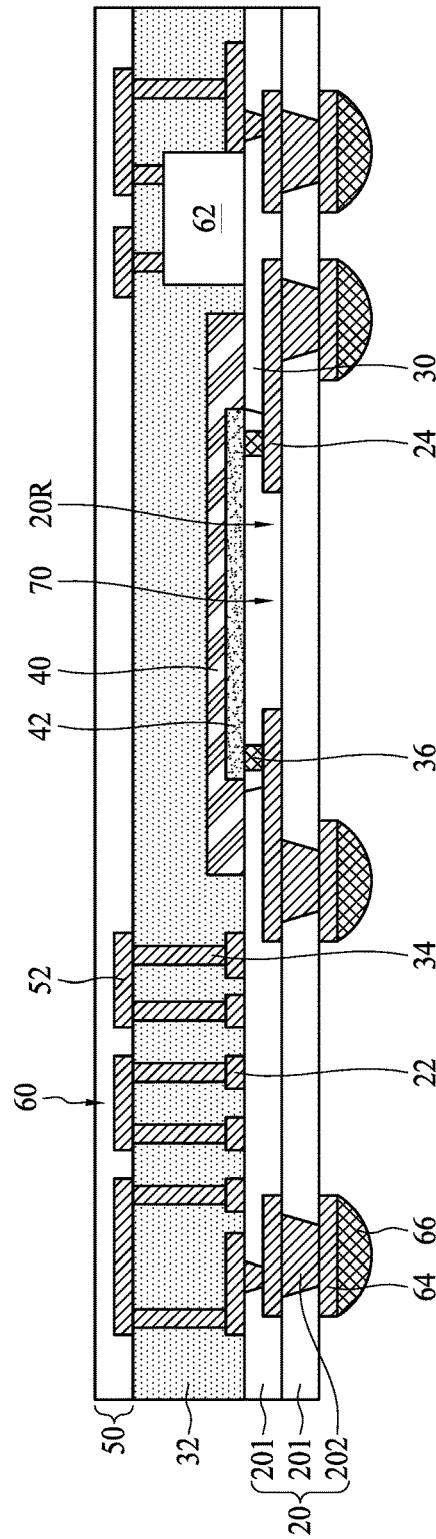
FIG. 7 illustrates a cross-sectional view of a MEMS device package in accordance with some embodiments of the present disclosure.

FIG. 7 is a cross-sectional view of a MEMS device package 4 in accordance with some embodiments of the present disclosure. In contrast to the MEMS device packages 1, 2 and 3 as shown in FIGS. 1, 3 and 5 respectively, in the MEMS device package 4, the partition wall 30 is a portion of the first circuit layer 20. In some embodiments, a portion of the insulative layer 201 of the first circuit layer 20 is removed to define a recess 20R, and the partition wall 30 is a portion of the first circuit layer 20 adjacent to the recess 20R. In some embodiments, the periphery of the MEMS component 40 is in contact with the partition wall 30 to enclose the space 70.

Figure 8A:
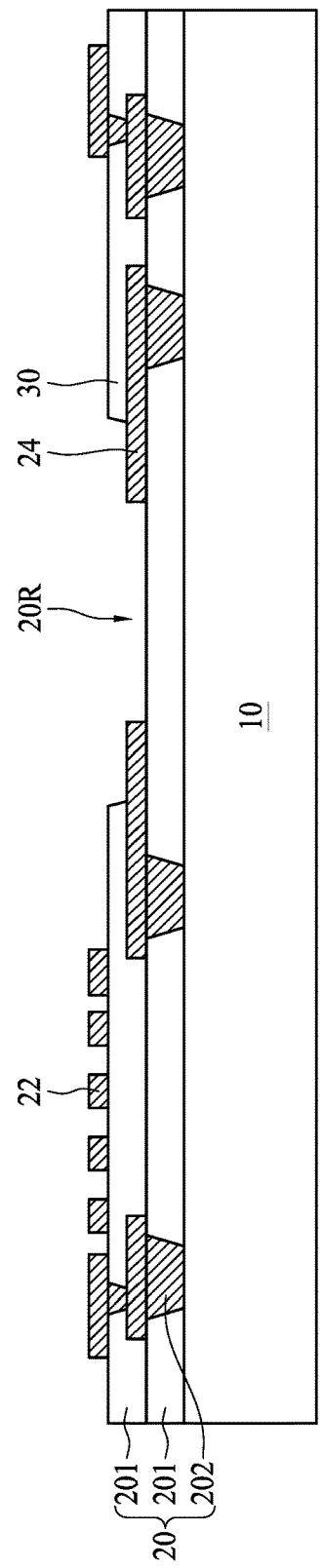
FIG. 8A illustrates one or more stages of an example of a manufacturing method of a MEMS device package in accordance with some embodiments of the present disclosure.

FIG. 8A, FIG. 8B, FIG. 8C and FIG. 8D illustrate various stages of an example of a manufacturing method of the MEMS device package 4 in accordance with some embodiments of the present disclosure. As depicted in FIG. 8A, a first circuit layer 20 is formed over a carrier 10. In some embodiments, a portion of the first circuit layer 20 is configured as connecting pads 24. In some embodiments, a recess 20R is defined in the first circuit layer 20 by removing a portion of the insulative layer 201, and the recess 20R exposes at least a portion of the connecting pads 24. In some embodiments, first conductive pieces 22 may be formed over the first circuit layer 20.

Figure 8B:
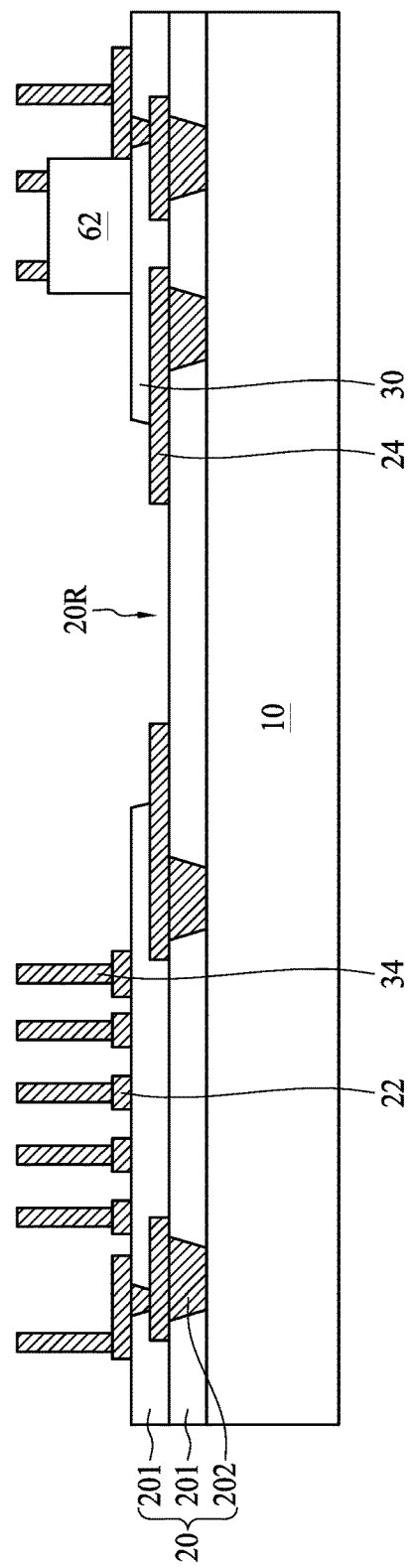
FIG. 8B illustrates one or more stages of an example of a manufacturing method of a MEMS device package in accordance with some embodiments of the present disclosure.

As depicted in FIG. 8B, induction pillars 34 are formed over the first circuit layer 20, and electrically connected to the first conductive pieces 22. In some embodiments, a second electronic component 62 may be disposed over the first circuit layer 20.

Figure 8C:
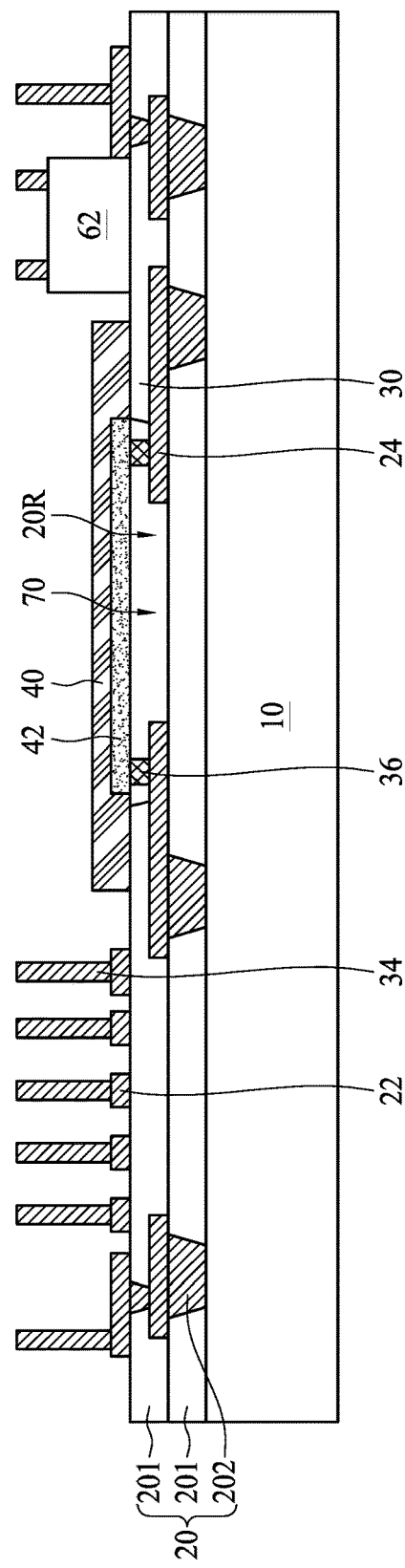
FIG. 8C illustrates one or more stages of an example of a manufacturing method of a MEMS device package in accordance with some embodiments of the present disclosure.

As depicted in FIG. 8C, a MEMS component 40 is disposed over the first circuit layer 20. In some embodiments, a portion of the first circuit layer 20 adjacent to the recess 20R is configured as a partition wall 30, and the periphery of the MEMS component 40 is in contact with the partition wall 30 to enclose the space 70. In some embodiments, the conductive pillars 36 may include conductive structures such as conductive bumps, conductive pastes or the like, which may also be configured as conductive adhesives to bond the MEMS component 40 and the connecting pads 24, and thus additional conductive structures may be omitted.

Figure 8D:
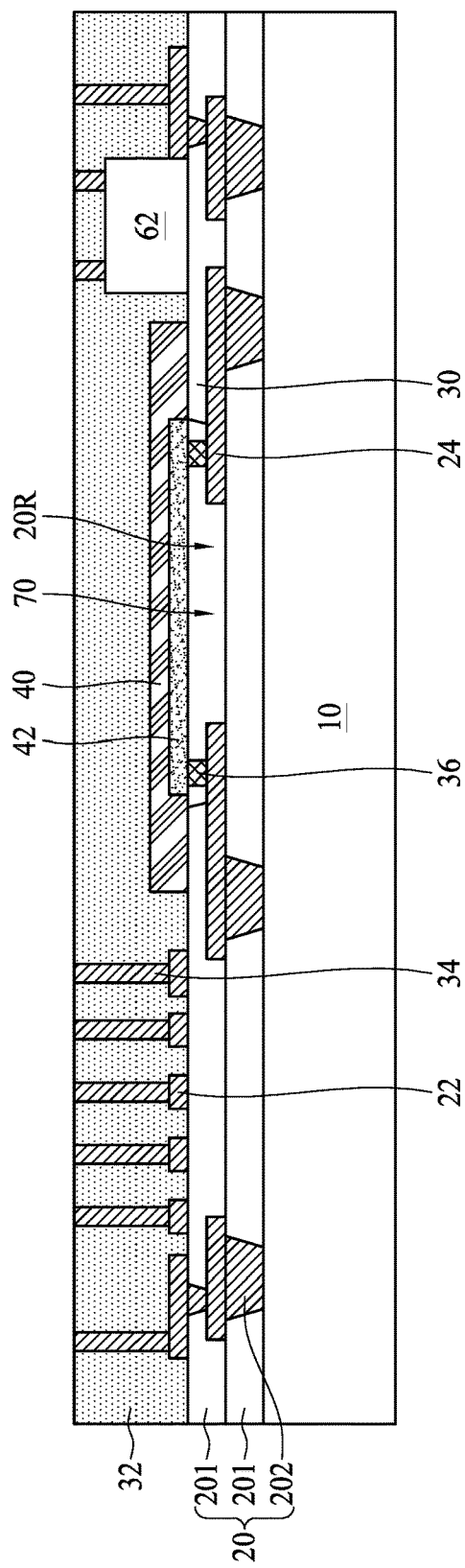
FIG. 8D illustrates one or more stages of an example of a manufacturing method of a MEMS device package in accordance with some embodiments of the present disclosure.

As depicted in FIG. 8D, a polymeric dielectric layer 32 is formed over the first circuit layer 20. In some embodiments, the polymeric dielectric layer 32 may be formed by, for example, dispensing a fluidic molding compound over the first circuit layer 20 and the MEMS component 40, and curing the fluidic molding compound. The polymeric dielectric layer 32 may pass through gaps between the induction pillars 34, but the polymeric dielectric layer 32 is restrained from entering the space 70 by the partition wall 30 and the MEMS component 40. In some embodiments, edges and an upper surface of the MEMS component 40 are enclosed by the polymeric dielectric layer 32.

In some embodiments, a second circuit layer 50 including the second conductive pieces 52 is further formed over the polymeric dielectric layer 32. The induction pillars 34 are interconnected between the first conductive pieces 22 and the second conductive pieces 52, and form the electronic component 60. The carrier 10 is released from the first circuit layer 20. In some embodiments, bonding pads 64 are formed over and electrically connected to the first circuit layer 20, and conductive bumps 66 are mounted over and electrically connected to the bonding pads 64, respectively. Accordingly, the MEMS device package 4 as shown in FIG. 7 is formed.

In some embodiments of the present disclosure, a space of a MEMS device package is defined between a first circuit layer and a MEMS component, and sealed by a partition wall. The partition wall may be integrated with fabrication of induction pillars or a circuit layer of the MEMS device package, and thus the MEMS device package may omit an additional substrate. Accordingly, the thickness of the MEMS device package can be reduced, and fabrication cost can be lowered.

As used herein, the singular terms "a," "an," and "the" may include a plurality of referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A Micro Electro-Mechanical System (MEMS) device package, comprising:
   a first circuit layer;
   a partition wall disposed over the first circuit layer;
   a MEMS component disposed over the partition wall and electrically connected to the first circuit layer, wherein the first circuit layer, the partition wall and the MEMS component enclose a space;
   a second circuit layer disposed over and electrically connected to the first circuit layer; and
   a polymeric dielectric layer disposed between the first circuit layer and the second circuit layer, wherein the polymeric dielectric layer is separated from the space by the partition wall.

2. The MEMS device package of claim 1, wherein the polymeric dielectric layer surrounds the partition wall, and the partition wall comprises a conductive partition wall.

3. The MEMS device package of claim 1, further comprising an electronic component disposed between the first circuit layer and the second circuit layer, and electrically connected to the MEMS component.

4. The MEMS device package of claim 3, further comprising a plurality of first conductive pieces disposed between the first circuit layer and the polymeric dielectric layer, and a plurality of second conductive pieces disposed in the second circuit layer, wherein the electronic component comprises a plurality of induction pillars extending through the polymeric dielectric layer and electrically connected to the first conductive pieces and the second conductive pieces.

5. The MEMS device package of claim 4, further comprising a plurality of conductive pillars disposed in the space, wherein the MEMS component is electrically connected to the first circuit layer through the plurality of conductive pillars, and the plurality of conductive pillars are surrounded by the partition wall.

6. The MEMS device package of claim 5, further comprising:
   a plurality of connecting pads disposed over the first circuit layer and electrically connected to the conductive pillars, respectively; and
   a landing pad disposed over the first circuit layer and connected to the partition wall, wherein the landing pad is disposed along a periphery of the space and surrounds the connecting pads.

7. The MEMS device package of claim 5, wherein a height of the partition wall and a height of at least one of the conductive pillars are substantially the same, and the height of the partition wall and the height of the at least one of the conductive pillars are lower than a height of at least one of the induction pillars.

8. The MEMS device package of claim 7, wherein at least a portion of the MEMS component is enclosed by the polymeric dielectric layer.

9. The MEMS device package of claim 8, wherein the first circuit layer defines a recess configured as a portion of the space.

10. The MEMS device package of claim 1, wherein the partition wall is a portion of the first circuit layer, and the space includes a recess defined by the first circuit layer.

11. The MEMS device package of claim 1, wherein the MEMS component comprises an active structure exposed to the space, and electrically connected to the first circuit layer.

12. The MEMS device package of claim 11, wherein the active structure comprises an acoustic wave structure.

13. A Micro Electro-Mechanical System (MEMS) device package, comprising:
    a first circuit layer;
    a MEMS component disposed over the first circuit layer, wherein the first circuit layer and the MEMS component define a space in between;
    a partition wall disposed over the first circuit layer and adjacent to the MEMS component; and
    a polymeric dielectric layer disposed over the first circuit layer, and separated from the space by the partition wall.

14. The MEMS device package of claim 13, further comprising a second circuit layer disposed over the polymeric dielectric layer.

15. The MEMS device package of claim 13, further comprising a plurality of conductive pillars disposed in the space, wherein the MEMS component is electrically connected to the first circuit layer through the plurality of conductive pillars, and the plurality of conductive pillars are surrounded by the partition wall.

16. The MEMS device package of claim 15, further comprising an electronic component disposed over the first circuit layer and adjacent to the MEMS component, wherein the electronic component comprises a plurality of induction pillars extending through the polymeric dielectric layer, and electrically connected to the first circuit layer.

17. The MEMS device package of claim 16, wherein a height of the partition wall and a height of at least one of the conductive pillars are substantially the same, and the height of the partition wall and the height of the at least one of the conductive pillars are lower than a height of at least one of the induction pillars.

18. The MEMS device package of claim 13, wherein the first circuit layer defines a recess configured as a portion of the space.

19. The MEMS device package of claim 13, wherein the first circuit layer defines a recess in communication with the space.

20. The MEMS device package of claim 13, wherein at least a portion of the MEMS component is enclosed by the polymeric dielectric layer.

* * * * *